(12) United States Patent
Stoafer et al.

(10) Patent No.: US 11,314,706 B2
(45) Date of Patent: Apr. 26, 2022

(54) METADATA AGGREGATION USING A TRAINED ENTITY MATCHING PREDICTIVE MODEL

(71) Applicant: Disney Enterprises, Inc., Burbank, CA (US)

(72) Inventors: Christopher C. Stoafer, Seattle, WA (US); Jordi Badia Pujol, Madrid (ES); Francesc Josep Guitart Bravo, Lleida (ES); Marc Junyent Martin, Barcelona (ES); Miquel Angel Farre Guiu, Bern (CH); Calvin Lawson, Seattle, WA (US); Erick L. Luerken, Seattle, WA (US)

(73) Assignee: Disney Enterprises, Inc., Burbank, CA (US)

( * ) Notice: Subject to any disclaimer, the term of this patent is extended or adjusted under 35 U.S.C. 154(b) by 76 days.

(21) Appl. No.: 16/999,767

(22) Filed: Aug. 21, 2020

(65) Prior Publication Data

US 2022/0058196 A1 Feb. 24, 2022

(51) Int. Cl.
*G06F 16/00* (2019.01)
*G06F 16/215* (2019.01)
(Continued)

(52) U.S. Cl.
CPC .......... *G06F 16/215* (2019.01); *G06F 9/4881* (2013.01); *G06F 11/3419* (2013.01); *G06F 11/3433* (2013.01); *G06F 16/1794* (2019.01); *G06F 16/217* (2019.01); *G06F 16/2462* (2019.01); *G06F 16/24542* (2019.01); *G06F 16/24549* (2019.01); *G06F 16/3346* (2019.01); (Continued)

(58) Field of Classification Search
CPC .. G06F 16/1794; G06F 16/215; G06F 16/217; G06F 16/24542; G06F 16/24549; G06F 16/2462; G06F 16/3346; G06F 16/383; G06F 11/3419; G06F 11/3433; G06F 9/4881; G06F 17/11; G06F 30/27
See application file for complete search history.

(56) References Cited

U.S. PATENT DOCUMENTS

8,126,881 B1 * 2/2012 Sethi ................. G06F 16/24578
707/723
10,915,233 B2 * 2/2021 Stojanovic ............ G06F 16/211
(Continued)

*Primary Examiner* — Diedra McQuitery
(74) *Attorney, Agent, or Firm* — Farjami & Farjami LLP (57) ABSTRACT

A metadata aggregation system includes a computing platform having a hardware processor and a memory storing a software code including a trained entity matching predictive model trained using training data obtained from a reference database. The hardware processor executes the software code to obtain metadata inputs from multiple sources, conform the metadata inputs to a common format, match, using the trained entity matching predictive model, at least some of the conformed metadata inputs to the same entity, and determine, using the trained entity matching predictive model, a confidence score for each match. The software code further sends a request to one or more human editor(s) for confirmation of each match having a confidence score greater than a first threshold and less than a second threshold, and updates the reference database, in response to receiving a confirmation that at least one match is a confirmed match, to include the confirmed match.

20 Claims, 4 Drawing Sheets

(51) Int. Cl.
*G06F 16/2453* (2019.01)
*G06F 9/48* (2006.01)
*G06F 11/34* (2006.01)
*G06F 16/21* (2019.01)
*G06F 16/178* (2019.01)
*G06F 16/2458* (2019.01)
*G06F 16/383* (2019.01)
*G06F 17/11* (2006.01)
*G06F 30/27* (2020.01)
*G06F 16/33* (2019.01)

(52) U.S. Cl.
CPC ............ *G06F 16/383* (2019.01); *G06F 17/11* (2013.01); *G06F 30/27* (2020.01)

(56) References Cited

U.S. PATENT DOCUMENTS

| | | | |
|---|---|---|---|
| 2019/0370687 A1* | 12/2019 | Pezzillo | G06N 20/00 |
| 2020/0104731 A1* | 4/2020 | Oliner | G06F 16/245 |
| 2021/0158939 A1* | 5/2021 | Mathur | G06F 11/3476 |

* cited by examiner

METADATA AGGREGATION USING A TRAINED ENTITY MATCHING PREDICTIVE MODEL

BACKGROUND

Popular movies, television programs, sports teams, and other pop culture "entities" are typically the subjects of extensive commentary from a variety of different sources. For example, a movie or movie franchise may be the subject of an entry in a publicly accessible knowledge base, may be reviewed or critiqued by a news organization, may have a dedicated fan website, and may be the subject of discussions on social media. For an owner or creator of such an entity, it may be desirable or even necessary to quickly identify and evaluate the descriptive metadata with which the entity is being tagged by the various sources of news and commentary. The advantages of doing so include enriching the metadata tags already associated with the entity by the entity owner or creator with accurate or laudatory metadata generated by other sources, as well as the prompt correction or removal of metadata tags that are inaccurate or improperly disparaging.

Due to the proliferation of potential sources of descriptive commentary made possible by Internet based communications and the growing diversity of social media platforms, timely manual identification and review of metadata tags by human editors in order to match entities on different sources is impracticable. In response, automated solutions for searching out metadata tags for use in performing entity matching have been developed. While offering efficiency advantages over manual tag searching, automated systems are more prone to error than human editors. Consequently, there is a need in the art for an entity matching solution capable of matching entities on different sources and across a variety of communications platforms that balances the efficiency enabled by automation with the accuracy provided by human review.

SUMMARY

There are provided systems and methods for performing metadata aggregation using a trained entity matching predictive model, substantially as shown in or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application discloses systems and methods for performing metadata aggregation using a trained entity matching predictive model that overcome the drawbacks and deficiencies in the conventional art. By using the trained entity matching predictive model to match metadata from different sources with an entity described by the metadata, and to further score the confidence of each match in an automated process, the present metadata aggregation solution advantageously provides substantially all of the efficiency benefits of a fully automated solution. In addition, by utilizing a "human-in-the-loop" process in which a human editor is called upon to confirm or reject only matches having a confidence value less than a certainty threshold, the present solution further advantageously enables the accuracy that has traditionally only been provided by manual metadata aggregation solutions.

It is noted that, as used in the present application, the term "entity" is defined as referring to any of a human person, a character, an organization, a unit of media content, or a media content collection having a common theme. Thus, as used herein, the term entity may refer to an athlete, a sports team, a sports league, a corporation, a business, a movie, a movie franchise, a video game, a linear television program or series, a web television program or series, an actor, a fictional character, a celebrity, news articles/segments, media advertisers, media distributors, to name a few examples.

It is further noted that as defined in the present application, the feature "trained entity matching predictive model" (also "machine learning model") refers to a mathematical model for making future predictions based on patterns learned from samples of data obtained from a set of trusted known matches and known mismatches, known as "training data." Various learning algorithms can be used to map correlations between input data and output data. These correlations form the mathematical model that can be used to make future predictions on new input data. Such a predictive model may include one or more logistic regression models, Bayesian models, or neural networks (NNs).

A "deep neural network," in the context of deep learning, may refer to a NN that utilizes multiple hidden layers between input and output layers, which may allow for learning based on features not explicitly defined in raw data. As used in the present application, a feature identified as a NN refers to a deep neural network. In various implementations, NNs may be trained as classifiers and may be utilized to perform image processing or natural-language processing.

It is also noted that, as used in the present application, the terms "automation," "automated," and "automating" refer to systems and processes that do not require human intervention. Although, in some implementations, a human system administrator may review or even modify the operation of the systems or the methods described herein, that human supervisory involvement is optional. Thus, with the exception of the limited match review performed by one or more human editors, as discussed in greater detail below, the actions described in the present application may be performed under the control of hardware processing components executing them.

Figure 1:
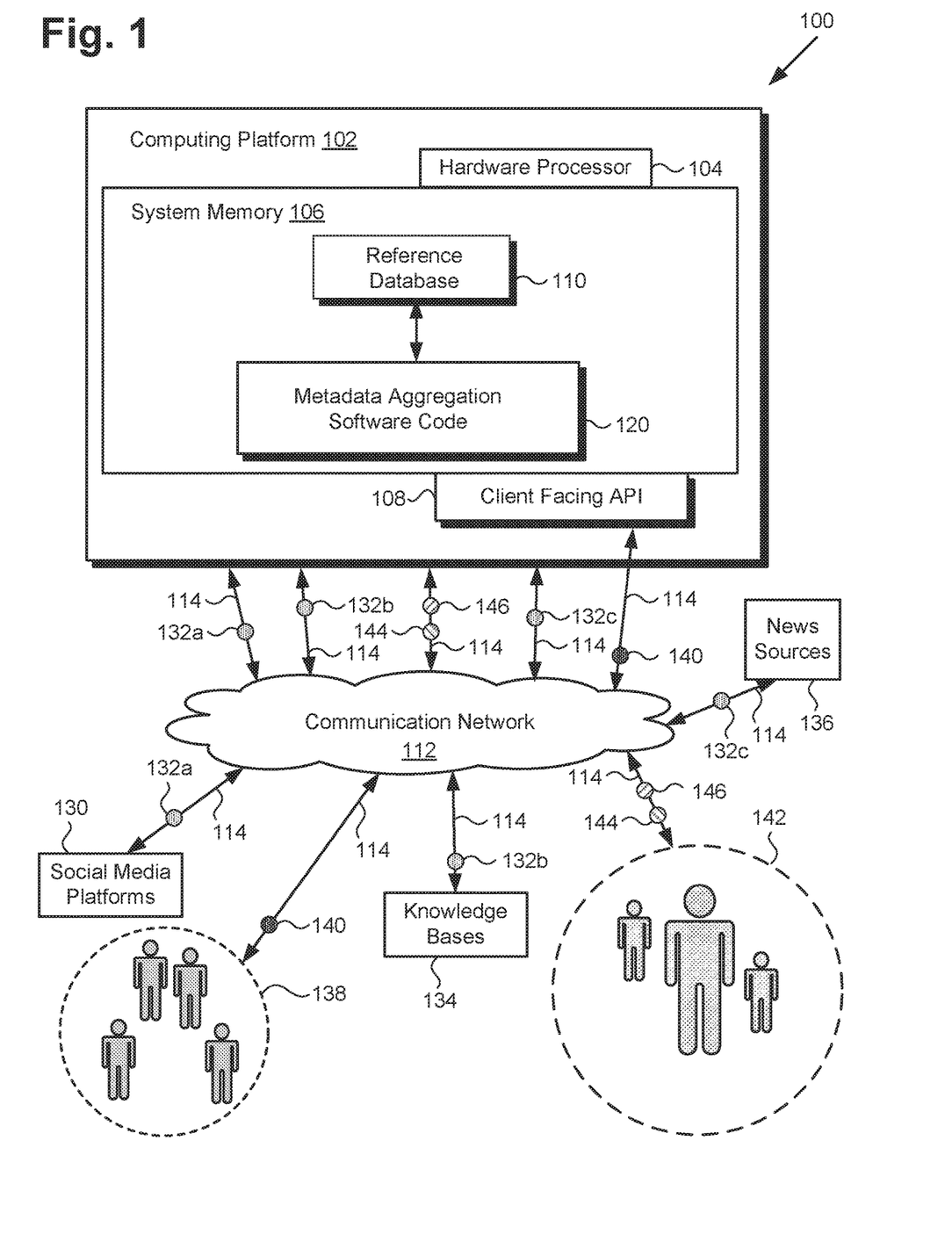
FIG. 1 shows a diagram of an exemplary system for performing metadata aggregation using a trained entity matching predictive model, according to one implementation.

FIG. 1 shows a diagram of an exemplary system for performing metadata aggregation using a trained entity matching predictive model, according to one implementation. As shown in FIG. 1, metadata aggregation system 100 is utilized within a use environment including communication network 112, multiple sources of entity descriptive metadata including one or more social media platforms 130 (hereinafter "social media platform(s) 130"), one or more knowledge bases 134 (hereinafter "knowledge base(s) 134"), and one or more news sources 136 (hereinafter "news source(s) 136"). In addition, FIG. 1 shows clients 138 of metadata aggregation system 100, as well as one or more human editors 142 (hereinafter "editor(s) 142"). Also shown in FIG. 1 are metadata inputs 132a, 132b, and 132c received by metadata aggregation system 100, entity queries 140 from clients 138, confirmation request 144 sent to editor(s) 142, confirmation 146 received by metadata aggregation system 100 from editor(s) 142, and network communication links 114 of communication network 112.

Metadata aggregation system 100 includes computing platform 102 having hardware processor 104, system memory 106 implemented as a non-transitory storage device, and client facing application programming interface 108 (hereinafter "client facing API 108"). According to the exemplary implementation shown in FIG. 1, system memory 106 may store reference database 110 providing training data for training a trained entity matching predictive model (not shown in FIG. 1), as well as metadata aggregation software code 120 including the trained entity matching predictive model.

It is noted that, although the present application refers to reference database 110 and metadata aggregation software code 120 as being stored in system memory 106 for conceptual clarity, more generally, system memory 106 may take the form of any computer-readable non-transitory storage medium. The expression "computer-readable non-transitory storage medium," as used in the present application, refers to any medium, excluding a carrier wave or other transitory signal that provides instructions to a hardware processor of a computing platform, such as hardware processor 104 of computing platform 102. Thus, a computer-readable non-transitory medium may correspond to various types of media, such as volatile media and non-volatile media, for example. Volatile media may include dynamic memory, such as dynamic random access memory (dynamic RAM), while non-volatile memory may include optical, magnetic, or electrostatic storage devices. Common forms of computer-readable non-transitory media include, for example, optical discs. RAM, programmable read-only memory (PROM), erasable PROM (EPROM), and FLASH memory.

It is further noted that although FIG. 1 depicts reference database 110 and metadata aggregation software code 120 as being mutually co-located in system memory 106, that representation is also merely provided as an aid to conceptual clarity. More generally, metadata aggregation system 100 may include one or more computing platforms, such as computer servers for example, which may be co-located, or may form an interactively linked but distributed system, such as a cloud based system, for instance. As a result, hardware processor 104 and system memory 106 may correspond to distributed processor and memory resources within metadata aggregation system 100. Thus, it is to be understood that any or all of reference database 110, metadata aggregation software code 120, and the various software components of metadata aggregation software code 120 described below by reference to FIG. 2, may be stored remotely from one another within the distributed memory resources of metadata aggregation system 100.

Metadata aggregation system 100 is configured to match entities stored on multiple sources. i.e., social media platform(s) 130, knowledge base(s) 134, and news source(s) 136, and to identify how a matched entity is described on each source on which it is included, in a substantially automated way. In addition, metadata aggregation system 100 may maintain reference database 110 as a consolidated repository of entities matched with metadata harvested from social media platform(s) 130, knowledge base(s) 134, and news source(s) 136. As a result, metadata aggregation system 100 can be used to significantly reduce the time required to match diversely sourced metadata with the entity it describes, thereby enhancing the richness and accuracy of the data stored on reference database 110.

Figure 2:
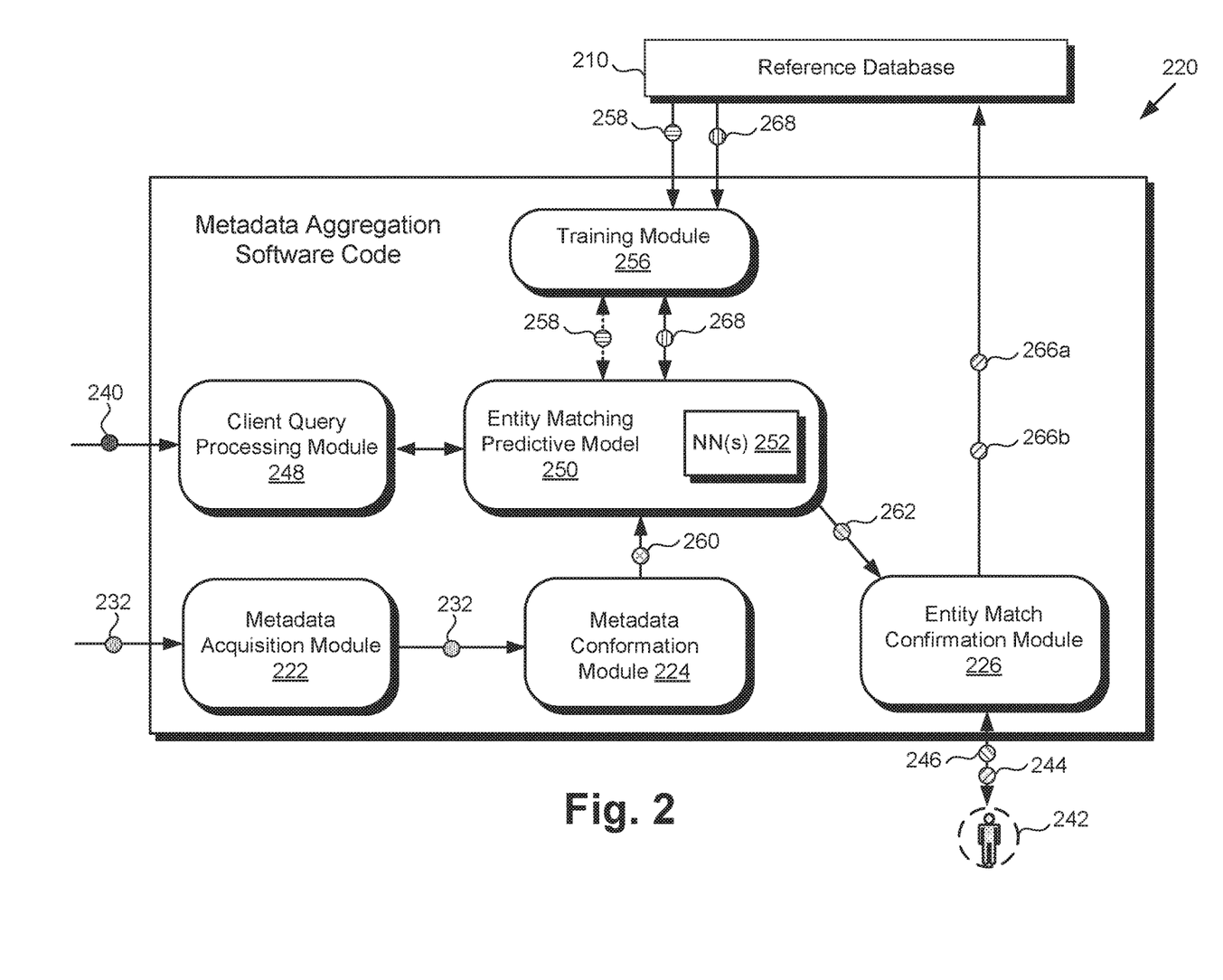
FIG. 2 shows an exemplary diagram of a software code including a trained entity matching predictive model and suitable for execution by a hardware processor of the system shown by FIG. 1, according to one implementation.

FIG. 2 shows exemplary metadata aggregation software code 220 suitable for execution by hardware processor 104 of computing platform 102, in FIG. 1, according to one implementation. As shown in FIG. 2, metadata aggregation software code 220 includes trained entity matching predictive model 250, which may itself include one or more NNs 252 (hereinafter "NN(s) 252"). It is noted that although FIG. 2 depicts trained entity matching predictive model 250 as including NN(s) 252, that implementation is merely exemplary. In other implementations, trained entity matching predictive model 250 may take the form of a logistic regression model or a Bayesian model, for example.

FIG. 2 further shows metadata inputs 232 and entity queries 240 received by metadata aggregation software code 220, confirmation request 244 sent to one or more human editors 242 (hereinafter "editor(s) 242"), and confirmation 246 received by metadata aggregation software code 220 from editor(s) 242. Also shown in FIG. 2 are training data 258 and updated training data 268 obtained by metadata aggregation software code 220 from reference database 210.

Metadata inputs 232 correspond in general to any or all of metadata inputs 132a, 132b, and 132c, in FIG. 1, while entity queries 240 correspond in general to entity queries 140 received by metadata aggregation system 100 from clients 138. Moreover, reference database 210, editor(s) 242, confirmation request 244, and confirmation 246, in FIG. 2, correspond respectively in general to reference database 110, editor(s) 142, confirmation request 144, and confirmation 146, in FIG. 1. Thus, metadata inputs 232, entity queries 240, reference database 210, editor(s) 242, confirmation request 244, and confirmation 246 may share any of the characteristics attributed to respective metadata inputs 132a/132b/132c, entity queries 140, reference database 110, editor(s) 142, confirmation request 144, and confirmation 146 by the present disclosure, and vice versa.

As further shown in FIG. 2, in addition to trained entity matching predictive model 250, metadata aggregation software code 220 can also include metadata acquisition module 222, metadata conformation module 224, client query processing module 248, and entity match confirmation module 226 providing confirmed matches 266a and 266b as outputs to reference database 110/210. Metadata aggregation software code 220 may also include training module 256 for training entity matching predictive model 250 using training data 258, as well as to retrain trained entity matching predictive model 250 using updated training data 268. FIG. 2 further shows conformed metadata 260 corresponding to metadata inputs 132*a*/132*b*/132*c*/232, and matching data 262 generated by trained entity matching predictive model 250.

Metadata aggregation software code 220 corresponds in general to metadata aggregation software code 120, and those corresponding features may share any of the characteristics attributed to either corresponding feature by the present disclosure. Thus, like metadata aggregation software code 220, metadata aggregation software code 120 may include trained entity matching predictive model 250, as well as features corresponding respectively to metadata acquisition module 222, metadata conformation module 224, client query processing module 248, entity match confirmation module 226, and training module 256.

By way of overview, metadata aggregation software code 120/220 is configured to ingest metadata inputs 132*a*/132*b*/132*c*/232 and to use one or more metadata fields to make comparisons between entities. For example, movie titles may be compared using the title, release date, run time, actors, unique identifiers such as EIDR and talent data. Machine learning features allow for discrepancies in the metadata by using specific comparison features. Levenshtein distance and word2vec similarities may be used on the entire title string and the discrete word tokens for string comparison. For example, the title "The Beasts" and "Beasts, The" are likely for the same entity. Comparisons are created for each metadata field and trained entity matching predictive model 250 is used to generate matching data 262 that includes a prediction whether the entities are a match or not and includes a confidence score for the predicted match. High confidence matches (i.e., confidence matches at or above a configurable high confidence threshold) may be automatically identified as confirmed matches by metadata aggregation software code 120/220, while low confidence matches (i.e., confidence matches at or below a configurable low confidence threshold) can be sent for review and confirmation by editor(s) 142/242.

Human review may occur in three stages: (1) reviewing matches, (2) quality assurance, and (3) checking non-matched entities. In the reviewing matches stage, the mid-confidence matches (i.e., confidence matches between the high confidence threshold and the low confidence threshold) from trained entity matching predictive model 250 are reviewed. By filtering out the low confidence matches (with few true matches) and automatically matching high confidence matches, metadata aggregation software code 120/220 advantageously reduces the number of reviews by editor(s) 142/242 while maintaining high accuracy.

In the quality assurance review stage, two sets of matches may be reviewed: flagged matches and a random sample of matches. The matches that are flagged for review may include any one-to-many or many-to-many matches between the metadata sources, i.e., social media platform(s) 130, knowledge base(s) 134, and news source(s) 136. If one entity in a first metadata source matches to two or more entities in a second metadata source, then there is either a duplicate in the second metadata source or an incorrect match. These cases may be marked and corrected in the review process. The random sample is used to continually ensure quality of matches. In the checking non-matched entities review process, any entity that has no matches between two metadata sources may be manually reviewed with one of three possible outcomes: the entity is missing in one or more metadata sources, there is not enough metadata to confidently identify a match, or the match was missed by trained entity matching predictive model 250.

Metadata aggregation software code 120/220 is configured to handle metadata sources that periodically update. Updates can include new entities or updates to the metadata of existing entities. The entity matching process may be run periodically to use the updated data to look for any new matches and review existing matches. It is noted that the frequency with which the entity matching process is run may vary based on the types of entities being matched. For example, in the case of sports entities, running the entity matching process weekly may be sufficient, while for news entities it may be advantageous or desirable to run the entity matching process more frequently, such as daily.

Another advantage to running the entity matching process periodically is that new entities might be created or a new scope of entity matching may be defined based on the requirements of clients 138 of metadata aggregation system 100. For example, trained entity matching predictive model 250 may initially be trained to match a scope of entities including football and basketball related entities. However, clients 138 may begin requesting matches of baseball entities. By changing the scope of entity matching performed by trained entity matching predictive model 250, and by running the entity matching process periodically the process would begin matching baseball entities as well. It is noted that trained entity matching predictive model 250 is configured to continuously learn and improve its predictive performance as additional matches are reviewed and entered into reference database 110/210.

It is further noted that entity matching discrepancies can be reviewed and corrected or compensated for. That is to say, in some implementations, an owner or administrator of one social media platform(s) 130, knowledge base(s) 134, and news source(s) 136 serving as metadata sources may be notified about a discrepancy between the metadata in its source from other metadata sources. For example, knowledge base(s) 134, and most of news source(s) 136 may agree on the date of birth of a particular athlete, while another of news source(s) 136, i.e., news source "D", includes a different date of birth. In that situation, after confirmation of the entity match by human editor(s) 142/242, metadata aggregation software code 120/220 may be executed by hardware processor 104 to notify news source "D" about the potentially incorrect date of birth so that it can be corrected.

However, some metadata sources may not accept correction. In those cases, reference database 110/210 may include information that metadata describing a specific property is wrong in a particular source, as well as the correct metadata description of that property. Metadata aggregation software code 120/220 may compensate for the identified inaccuracy by omitting the inaccurate metadata property when performing entity matching, or by substituting the corrected metadata description stored in reference database 110/210.

The sources of metadata inputs 132*a*/132*b*/132*c*/232 are typically independent of one another, which means that entity properties can be added, removed, or edited. Therefore, the present entity matching solution is not executed once, but is part of a continuous effort to: 1) match entities using machine learning with a human-in-the-loop approach, and 2) track entity queries 140/240 from clients 138 and the performance of trained entity matching predictive model 250 in response to entity queries 140/240 in order to drive the priority of the entity matching backlog. That is to say, it may be advantageous or desirable to reduce any performance deficiencies by trained entity matching predictive model 250 related to the most requested entity matches first. In some implementations, the present solution may further include notifying the owners of the sources of metadata inputs 132a/132b/132c/232 when a group of entities that matched previously no longer match due to a property update. This allows the owners or administrators of those metadata sources that accept correction to update their respective databases accordingly.

Figure 3A:
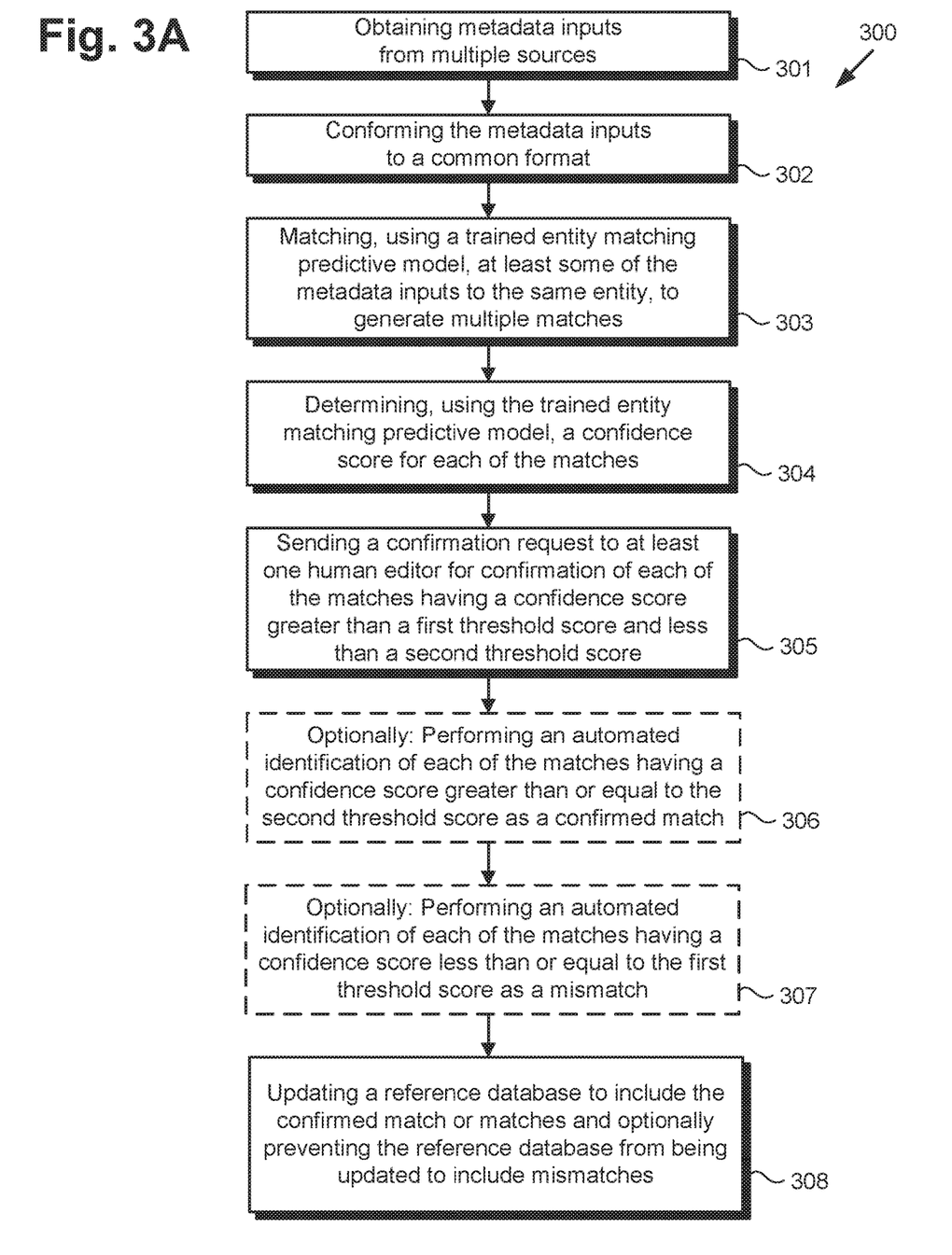
FIG. 3A is a flowchart presenting an exemplary method for performing metadata aggregation using a trained entity matching predictive model, according to one implementation.
Figure 3B:
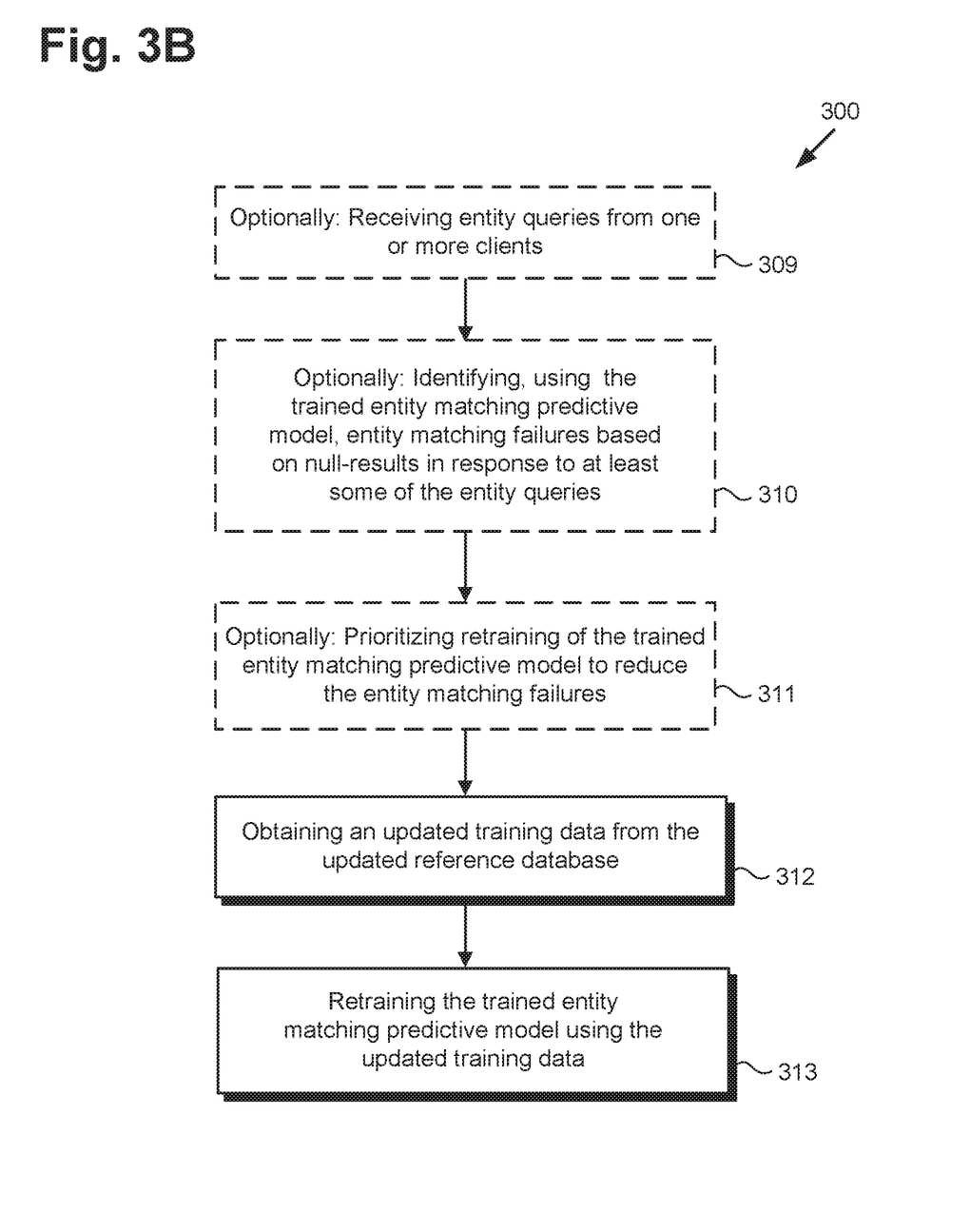
FIG. 3B is a flowchart presenting exemplary additional actions for extending the method outlined in FIG. 3A, according to one implementation.

The functionality of metadata aggregation software code 120/220 will be further described by reference to FIGS. 3A and 3B in combination with FIGS. 1 and 2. FIG. 3A shows flowchart 300 presenting an exemplary method for use by system 100 for performing metadata aggregation using trained entity matching predictive model 250, according to one implementation, while FIG. 3B shows exemplary additional actions extending the exemplary method outlined in FIG. 3A. With respect to the method outlined in FIGS. 3A and 3B, it is noted that certain details and features have been left out of flowchart 300 in order not to obscure the discussion of the inventive features in the present application.

Referring now to FIG. 3A in combination with FIGS. 1 and 2, flowchart 300 begins with obtaining metadata inputs 132a/132b/132c/232 from multiple sources, such as social media platform(s) 130, knowledge base(s) 134, and news source(s) 136 (action 301). In some implementations, it may be advantageous or desirable to obtain metadata inputs 132a/132b/132c/232 in action 301 by affirmatively pulling that metadata from one or more of social media platform(s) 130, knowledge base(s) 134, and news source(s) 136 in order to define and control the scope of metadata inputs 132a/132b/132c/232 being obtained.

Metadata inputs 132a/132b/132c/232 may be character strings describing one or more entities, for example. Metadata inputs 132a/132b/132c/232 may be obtained from one or more of social media platform(s) 130, knowledge base(s) 134, and news source(s) 136 in action 301 by metadata aggregation software code 120/220, executed by hardware processor 104 of computing platform 102, and using metadata acquisition module 222. As shown in FIG. 1, in some implementations, metadata aggregation software code 120/220 may obtain metadata inputs 132a/132b/132c/232 from one or more of social media platform(s) 130, knowledge base(s) 134, and news source(s) 136 via communication network 112 and network communication links 114.

Flowchart 300 continues with conforming metadata inputs 132a/132b/132c/232 to a common format (action 302). Hardware processor 104 may execute metadata aggregation software code 120/220 to utilize metadata conformation module 224 to conform metadata inputs 132a/132b/132c/232 to a common format. Attempting to match raw metadata inputs 132a/132b/132c/232 without first conforming them to a common format would typically result in a poorly performing predictive model. In use cases in which metadata inputs 132a/132b/132c/232 take the form of character strings, for example, conformation of metadata inputs 132a/132b/132c/232 may include converting all strings to American Standard Code for Information Interchange (ASCII), standardizing on lower case characters, and applying custom regular expression (regex) functions, as known in the art, to deal with "dirty metadata" inputs. It is noted that as used herein, the term "dirty metadata" refers to metadata that is malformed or contains extraneous noisy data that requires removal. For example, the title "Project Z" needs to be identifiable from within the string "SOE_01_003_ Project_Z_Video" It is noted that date and time values included in metadata inputs 132a/132b/132c/232 are often represented differently in different sources, but in order for them to be compared a consistent representation is needed. For example, for professional athlete entities, action 302 may include standardizing birth dates to the year, month, day tuple (YYYY. MM, DD). This conformation enables calculation of the difference between the full dates and any portion of the dates. It is further noted that in use cases in which metadata included in one of metadata inputs 132a/132b/132c/232 is omitted from another of metadata inputs 132a/132b/132c/232, the missing metadata may have to be derived in order for comparison to proceed.

By way of example, for human being entities, metadata conformation module 224 may include a "Human Name" parser to separate first, middle, and last name, as well as suffix. Matching those values separately can enable derivation of an absent value. For instance where metadata inputs 132a and 132b include the first, middle, and last name of person A, but metadata input 132c includes only the first and last name of person A, matching those first and last names across metadata inputs 132a. 132b, and 132c may result in derivation of the middle name omitted from metadata input 132c based on the middle name included in metadata inputs 132a and 132b. Action 302 results in generation of conformed metadata 260 corresponding to metadata inputs 132a/132b/132c/232.

Flowchart 300 continues with matching, using trained entity matching predictive model 250, at least some of conformed metadata 260 to the same entity to generate matches (action 303). Trained entity matching predictive model 250 may be a predictive model that has previously been trained by training module 256 of metadata aggregation software code 120/220 using training data 258 obtained by training module 256 from reference database 110/210. As noted above, trained entity matching predictive model 250 may include NN(s) 252. Moreover, in implementations in which trained entity matching predictive model 250 includes multiple NNs 252. NNs 252 may be used sequentially, in parallel, or selectively in action 303. However, as also noted above, although FIG. 2 depicts trained entity matching predictive model 250 as including NN(s) 252, that implementation is merely exemplary. In other implementations, trained entity matching predictive model 250 may take other forms, such as a logistic regression model or a Bayesian model, for example. Action 303 may be performed by metadata aggregation software code 120/220, executed by hardware processor 104 of computing platform 102, and using trained entity matching predictive model 250.

Trained entity matching predictive model 250 may utilize an estimator, h(X), which takes feature vector X of features from two data sources being matched (e.g. "Levenshtein Distance of First Name". "How many days apart are the listed birthdays") and attempts to estimate Y, which is either zero (the entities do not match) or one (the entities do match). The estimator may map these inputs from d-dimensional feature space, $\mathfrak{F}^d$, into a value between zero and one as a best guess of the label of Y. i.e. h: $(X) \rightarrow [0,1] = \hat{Y}$, $X \in \mathfrak{F}^d$. Trained entity matching predictive model 250 is trained on a labeled dataset, D, which is partitioned into three disjoint groups: training data 258 ($D_{Train}$), validation data ($D_{Valid}$), and test data ($D_{Test}$). Training data 258 is used to train entity matching predictive model 250 and when an acceptable model is found, trained entity matching predictive model 250 is evaluated on the validation data to see how well the trained entity matching predictive model 250 is generalizing to new information. This process is repeated until an optimal model is found. For example, several parameterizations of different models may be used on the validation data, and the model/parameterization combination having the best performance metrics may be identified as optimal. $D_{Train}$ and $D_{Valid}$ may then be combined, the estimator may be refitted, and the refitted estimator is evaluated on the test data. This evaluation is typically done only once as a final check of how well the trained entity matching predictive model 250 is generalizing.

It is noted that the matching performed in action 303 may be based on different metadata types and different comparison criteria depending on the type of entity being matched. For example, where the entity is a professional athlete, the metadata being compared may include first name, last name, date of birth, professional teams for which the athlete is playing or has played, or a combination thereof. In such an implementation, the comparison criteria applied to the first name and the last name may be their respective Levenshtein distances, while the criteria applied to the date of birth may include the Levenshtein distance for the entire date of birth tuple, as well as individual comparisons of the year, month, and day values.

Alternatively, where the entity is a movie, the metadata being compared may include movie title, duration, release date, production studio, director, a list of actors appearing in the movie, any standard identifier such as EIDR, or a combination thereof. As yet another example, where the entity is a television series, the metadata being compared may include the series title, the number of seasons, the number of episodes, the original air date, the production studio, director, a list of actors appearing in the television series, or a combination thereof.

The matching performed in action 303 may include using already matched data to improve "child" match rates. One example is the hierarchy of sports data. Professional athletes are typically on teams, or at least play in leagues. Teams are in leagues, and leagues are associated with a sport. To start, sports could be matched across all the different sources. This is important because different sources may represent sports differently, for example "Association Football" versus "Soccer." Once sports are matched, leagues may be matched using the previous matched sports to inform the league match. For example, instead of matching the tuple "('Mexican Liga A', 'Soccer')" to "('Liga MX', 'Association Football')", the tuple may be matched to "('Liga MX'. 'Soccer')."

Although the above example is at the league level of the hierarchy, the same methodology may be applied at the team level and the athlete level as well. For example to match teams once sports and leagues are matched, instead of matching the tuple "('Manchester United', 'EPL', 'Soccer')" to "('Manchester United Red Devils', 'English Premier League', 'Association Football')", the tuple may be matched to "('Manchester United', 'English Premier League'. 'Soccer')." As another example, when matching individual athletes once sports, leagues, and teams are matched, instead of matching the tuple "('Paul Pogba', 'Manchester United', 'EPL', 'Soccer')" to "('Paul Labile Pogba', 'Manchester United Red Devils', 'English Premier League', 'Association Football')", the tuple may be matched to "('Paul Pogba', 'Manchester United', 'English Premier League', 'Soccer')." The benefits are greatest when matching athletes. Otherwise, the differences in the hierarchy would accumulate because athletes are associated with teams, leagues, and sports. But because the hierarchy is standardized, those associations become exact matches that greatly improve the performance of trained entity matching predictive model 250.

Some of the values being matched are one-to-many with the entity being matched. For example, athletes can have been on multiple teams, or even in multiple leagues. Moreover, they might have more than one name, or have nicknames that are commonly used, or may have changed their name. For example, a female athlete may change her surname due to marriage. Because metadata inputs 132a/132b/132c/232 are obtained from sources that may not have traditional referential integrity, it may be advantageous to assume that any value can be a one-to-many match. To handle this, those values can be aggregated into lists, with one list per value per distinct entity being matched. These values may then be compared to one another as a many-to-many relationship. This procedure makes comparison more complicated but it utilizes all available metadata. In the case of a name change, for example, finding a single instance of a name change form a single source may be flagged as a potential mismatch and sent for human review. However, multiple instances of the same name change aggregated from multiple independent sources may be accepted as matches without human review.

Flowchart 300 continues with determining, using trained entity matching predictive model 250, a confidence score for each of the matches generated in action 303 (action 304). Determination of the confidence score for each of the matches generated in action 303 may be performed by metadata aggregation software code 120/220, executed by hardware processor 104 of computing platform 102, and using trained entity matching predictive model 250 to output matching data 262. It is noted that matching data 262 includes each match generated in action 303 and its associated confidence score determined in action 304. Action 304 can be performed using either of at least two exemplary techniques.

Exemplary Technique 1: One approach includes performing a form of grid-search to find the confidence score rejection threshold ($T_R$) and the confidence score acceptance threshold ($T_A$) subject to some pre-defined constraints. This requires two values $\alpha, \beta$ which are used to find $T_A$ and $T_R$, respectively. $T_A$ may be defined as:

$$T_A = \min_{p \in [0,1]} P(Y=0|h(X) \geq p) \leq \alpha \quad \text{(Equation 1)}$$

$T_R$ may be defined as:

$$T_R = \max_{q \in [0,1]} P(Y=1|h(X) \geq q) \leq \beta \quad \text{(Equation 2)}$$

That is to say, $T_A$ represents the smallest number, p, such that the proportion of mismatches classified as matches is less than $\alpha$. Likewise $T_R$ represents the smallest number, q, such that the proportion of matches classified as mismatches is less than $\beta$.

To approximate $P(Y=0|h(X) \geq p)$ and $P(Y=1|h(X) \geq q)$, the sample proportions from the Training and Validation data may be used, i.e.:

$$P(Y=0 \mid h(X) \geq p) \approx \frac{\sum_{X \in D^*} I(Y=0 \,\&\, h(X) \geq p)}{\sum_{X \in D^*} I(h(X) \geq p)} \quad \text{(Equation 3)}$$

And $$P(Y=1 \mid h(X) \leq q) \approx \frac{\sum_{X \in D^*} I(Y=0 \,\&\, h(X) \leq q)}{\sum_{X \in D^*} I(h(X) \leq p)} \quad \text{(Equation 4)}$$

Where I( . . . ) is an indicator function that is one if the conditions are met and zero otherwise, and D* represents some data set. $T_A$ and $T_R$ can be found by searching possible values of p and q respectively, through testing of all possible values [0, 0.01, 0.02, . . . , 0.98, 0.99, 1].

The following steps may then be performed:
1) Using $D_{Train}$, find h(X) and use this to determine $T_A$ and $T_R$. Then analyze how well h(X) performs using these settings.
2) Keeping the same thresholds, evaluate the performance of the estimator, h(X), on $D_{Valid}$.
   a. If the performance of the estimator, h(X), is reasonably consistent between $D_{Train}$ and $D_{Valid}$ (i.e. weighted f1-scores, Area Under the Curve (AUC), or other such metrics are close across the sets) then combine $D_{Train}$ and $D_{Valid}$ and recalculate $T_A$ and $T_R$.
   b. If the estimator performance is not comparable, determine if the datasets appear to be representative or refit h(X) and then repeat step 1. That is to say, if the performance of the estimator, h(X), is inconsistent between $D_{Train}$ and $D_{Valid}$, either or both of two techniques can be employed. One technique is to examine the datasets to verify that they are representative of each other, and if they are not, correct them if possible. Alternatively, or in addition, a second technique is to update the estimator and try again. Thus, it is possible that the estimator is good but the datasets are not representative, or that the datasets are representative and the estimator is bad, or that the datasets and the estimator are bad.
3) Evaluate both estimator performance on $D_{Test}$ and find $\widetilde{T_A}$ and $\widetilde{T_R}$ using only $D_{Test}$.
   a. If estimator performance is not comparable, then create new $D_{Train}$, $D_{Valid}$ and $D_{Test}$ and begin the modeling process at step 1.
   b. If estimator performance is comparable, then move to step 4.
4) Compare $T_A$ and $T_R$ with $\widetilde{T_A}$ and $\widetilde{T_R}$ (respectively).
   a. If $T_A = \min(\widetilde{T_A}, T_A)$, or $(T_A - \widetilde{T_A}) \leq a$ where $a \in [0,1)$ is a pre-determined level, use $T_A$ as the Acceptance Threshold.
   b. If $(T_A - \widetilde{T_A}) > a$, set $\widetilde{T_A} - \max(1.5 \cdot (T_A - \widetilde{T_A}), 2a)$ as the Acceptance Threshold.
   c. If $T_R = \max(\widetilde{T_R}, T_R)$, or $(\widetilde{T_R} - T_R) \leq a$ where $a \in [0,1)$ is a pre-determined level, use $T_R$ as the Rejection Threshold.
   d. If $(\widetilde{T_R} - T_R) > a$, set $\widetilde{T_R} + \max(1.5 \cdot (\widetilde{T_R} - T_R), 2a)$ as the Rejection Threshold.

Exemplary Technique 2: Alternatively, a fully Bayesian treatment may be performed. By way of example, consider use of a logistic regression model as the estimator, h(X). Given n pairs of data D=(($X_1$, $Y_1$), . . . , ($X_n$, $Y_n$)), where $X_i$ are d-dimensional features and each $Y_i$ is independently either 0 or 1, it can be assumed that $Y_i \sim \text{Bernoulli}(p_i)$. This means that the likelihood function for all n samples is $$\prod_{i=1}^{n} \left( \frac{e^{\beta_0 + \beta_1 X_{i,1} + \ldots + \beta_d X_{i,d}}}{1 + e^{\beta_0 + \beta_1 X_{i,1} + \ldots + \beta_d X_{i,d}}} \right)^{Y_i} \quad \text{(Equation 5)}$$

$$\left( 1 - \frac{e^{\beta_0 + \beta_1 X_{i,1} + \ldots + \beta_d X_{i,d}}}{1 + e^{\beta_0 + \beta_1 X_{i,1} + \ldots + \beta_d X_{i,d}}} \right)^{1-Y_i}$$

Traditionally this is the end of the line. However, in a Bayesian framework, there is uncertainty in the coefficients $\beta_0, \beta_1, \ldots, \beta_d$ and the only thing that is concrete is the data. That data can be used to update the prior estimate of the coefficients, known as the posterior distribution. For example, it is reasonable to assume that all coefficients are independently drawn from a normal distribution centered around zero and having large variance, e.g., $\beta_j \sim N(0, 1000)$. Then with this knowledge, the posterior distribution of the coefficients can be found as the likelihood times the prior:

$$\left[ \prod_{i=1}^{n} \left( \frac{e^{\beta_0 + \beta_1 X_{i,1} + \ldots + \beta_d X_{i,d}}}{1 + e^{\beta_0 + \beta_1 X_{i,1} + \ldots + \beta_d X_{i,d}}} \right)^{Y_i} \right. \quad \text{(Equation 6)}$$

$$\left. \left( 1 - \frac{e^{\beta_0 + \beta_1 X_{i,1} + \ldots + \beta_d X_{i,d}}}{1 + e^{\beta_0 + \beta_1 X_{i,1} + \ldots + \beta_d X_{i,d}}} \right)^{1-Y_i} \right] \times$$

$$\left[ \prod_{j=0}^{d} \frac{1}{\sqrt{2\pi} \cdot 1000} e^{-\frac{1}{2}\left(\frac{\beta_j}{1000}\right)^2} \right]$$

Having a posterior distribution provides a significant advantage in analysis. Not only does this enable traditional estimation of match probabilities, but there is now a full distribution around the coefficients that can be used in turn to provide a distribution around each individual match probability. Unfortunately, the above equation cannot be solved analytically. Nevertheless, a solution can be efficiently approximated using software.

One possible solution route is to mimic the approach described above, but with a Cauchy distribution for the coefficients. This encourages sparse regression and assists in generalization. A probabilistic programming paradigm can be used to calculate the posterior distribution of the coefficients in the estimator. Next, samples can be drawn from the posterior distribution so that for every observation, $X_i$, a probability distribution can be constructed around each estimation h($X_i$), which is denoted $f(h(X_i))$.

With these distributions, the distributional summaries can be calculated, such as a highest posterior density (HPD), around each observation $f(h(X_i))$. As a result, the core idea described in Exemplary Technique 1 above can be modified by using the credible intervals of the densities. In particular, an approximately 94% HPD is recommended in lieu of h(X) and then using the lower-bound for finding $T_A$ and $T_R$.

$$T_A = \min_{p \in [0,1]} P(Y = 0 \mid HPD(f(h(X)), LB) \geq p) \geq \alpha \quad \text{(Equation 7)}$$

And $$T_R = \min_{q \in [0,1]} P(Y = 1 \mid HPD(f(h(X)), UB) \leq q) \leq \beta \quad \text{(Equation 8)}$$

Where HPD($f$(h(X)), UB) and HPD($f$(h(X)), LB) are the respective Upper (UB) and Lower bound (UB) $94^{th}$ percentile Highest Posterior Density of the probability distribution of the estimator, $f$(h(X)). From this point, all other remaining outlined procedures are followed as described above in Exemplary Technique 1.

It is noted that a significant advantage of a fully Bayesian approach is that it can take advantage of specific estimate uncertainties. For example, if $f$(h(X)) spans are large range, that fact should be considered when determining the desirability of human-in-the-loop manual review. This should theoretically assist in minimizing false positives/false negatives by incorporating estimation uncertainty. In addition to this, there is increased flexibility in specifying error and coefficient distributions, which may be of assistance in training entity matching predictive model 250. This is achievable by setting priors, partitioning training data 258 into smaller chunks, learning the posterior distribution, and then using this as the prior distribution in a next round of data. It is further noted that although flowchart 300 shows action 303 as preceding action 304, that representation is merely exemplary. In some implementations, action 303 and 304 may be performed substantially concurrently.

Flowchart 300 continues with sending confirmation request 144/244 to human editor(s) 142/242 for confirmation of each of the matches generated in action 303 having a respective confidence score greater than a first threshold score, i.e., $T_R$, and less than a second threshold score, i.e., $T_A$ (action 305). That is to say, confirmation request 144/244 is sent to human editor(s) 142/242 for confirmation of the mid-confidence matches described above. Action 305 may be performed by metadata aggregation software code 120/220, executed by hardware processor 104, and using entity match confirmation module 226.

In some implementations, the second threshold score $T_A$ may be considered sufficiently robust that any match generated in action 303 having a confidence score greater than or equal to $T_A$ may be confidently considered to be a confirmed match, even in the absence of human-in-the loop manual review by editor(s) 142/242. i.e., $T_A$ may be a certainty threshold. In those implementations, the method outlined by flowchart 300 may continue with optionally identifying any match having a confidence score greater than or equal to $T_A$ as confirmed match 266a (action 306). Moreover, action 306 may be performed as an automated process by metadata aggregation software code 120/220, executed by hardware processor 104, and using entity match confirmation module 226.

In some implementations, it may be advantageous or desirable to consider any match generated in action 303 having a confidence score less than or equal to $T_R$ to be a mismatch, thereby relieving editor(s) 142/242 of the burden of manually reviewing matches that are likely to be inaccurate. In those implementations, the method outlined by flowchart 300 may continue with optionally identifying any match having a confidence score less than or equal to $T_R$ as a mismatch (action 307). Furthermore, action 307 may be performed as an automated process by metadata aggregation software code 120/220, executed by hardware processor 104, and using entity match confirmation module 226.

It is noted that although flowchart 300 shows action 305 as preceding optional actions 306 and 307, that representation is merely exemplary. In some implementations in which optional actions 306 and 307 are performed, one or both of those optional actions may precede action 305. In addition, when performed, optional actions 306 and 307 may be performed in any order. Moreover, in some implementations in which one or both of optional actions 306 and 307 are included in the method outlined by flowchart 300, that/those actions may be performed substantially concurrently with action 305.

It is also noted that in implementations in which optional action 306 is omitted from the method outlined in FIG. 3A, all matches generated in action 303 having a confidence score greater than $T_R$ may be sent to human editor(s) 142/242 for review and confirmation. Furthermore in implementations in which optional action 307 is omitted, matches having a confidence score less than or equal to $T_R$ may be sent to human editor(s) 142/242 for review.

In some implementations, as shown by FIG. 3A, flowchart 300 can conclude with updating reference database 110/210 to include one or more of confirmed matches 266a and 266b in reference database 110/210 (action 308). For example, in some implementations, action 308 may be performed by metadata aggregation software code 120/220 in response to receiving confirmation 146/246 of at least one of the matches generated in action 303 as confirmed match 266b from human editor(s) 242. In addition, in implementations in which optional action 306 is performed, hardware processor 104 may execute metadata software code 120/220 to update reference database 110/210 to include confirmed match 266a in an automated process. In implementations in which optional action 307 is performed, action 308 may include preventing, by metadata aggregation software code 120/220 executed by hardware processor 104, reference database 110/210 from being updated to include the mismatch identified in optional action 307.

In some implementations, action 308 may further include notifying the owners of the sources of metadata inputs 132a/132b/132c/232 when a group of entities that matched previously no longer match due to a property update, or when new matches are confirmed. This allows the owners or administrators of those metadata sources that accept correction to update their respective databases accordingly.

Action 308 results in enrichment of the entity matched dataset stored in reference database 110/210 through the addition of one or more confirmed matches 266a and 266b. Furthermore, that enrichment of the dataset stored in reference database 110/210 may occur anew each time the method outlined in FIG. 3A is performed. That repeatedly enriched dataset stored in reference database can be used to periodically retrain trained entity matching predictive model 250, thereby continually improving the performance of trained entity matching predictive model 250 over time.

For example, and as shown in FIG. 3B, in some implementations, flowchart 300 may continue from action 308 directly to action 312, in which hardware processor 104 executes metadata aggregation software code 120/220 to obtain updated training data 268 from reference database 110/210 after the updating of reference database 110/210 performed in action 308. In those implementations, hardware processor 104 may further execute metadata aggregation software code 120/220 to use training module 256 to retrain trained entity matching predictive model 250 using updated training data 268 (action 313). It is noted that retraining of trained entity matching predictive model 250 using updated training data 268 may proceed in a manner similar to that described above with respect training of entity matching predictive model 250 using training data 258.

In some implementations, trained entity matching predictive model 250 may be retrained using all available updated training data 268. However, in other implementations, it may be advantageous or desirable to track entity matching failures by trained entity matching predictive model 250 and to select updated training data 268 so as to tailor retraining of trained entity matching predictive model 250 to reduce the entity matching failures.

For example, as shown in FIG. 3B, prior to obtaining updated training data 268 for retraining trained entity matching predictive model 250, flowchart 300 may include optionally receiving entity queries 140/240 from one or more clients 138 of metadata aggregation system 100 (action 309). As shown in FIGS. 1 and 2, entity queries 140/240 may be received in optional action 309 via client facing API 108.

As further shown in FIGS. 1 and 2, optional action 309 may be performed by metadata aggregation software code 120/220, executed by hardware processor 104, and using client query processing module 248.

As also shown in FIG. 3B, in implementations in which optional action 309 is performed, flowchart 300 may continue with optionally identifying entity matching failures based on null-results in response to at least some of entity queries 140/240 (action 310). It is noted that the entity matching failures identified in optional action 310 are not necessarily a performance deficiency of trained entity matching predictive model 250. For example, entity queries 140/240 may reveal that null-results in response to some of entity queries 140/240 were due to: a) the scope of entities that trained entity matching predictive model 250 has been trained to match does not align with match requests included in entity queries 140/240, or b) there is a long queue of matches needing confirmation by human editor(s) 142/242 and the entities related to entity queries 140/240 from clients 138 have not been prioritized. An appropriate solution to problem a) is to modify the scope of entities that are matched, while an appropriate solution to problem b) is to reorder the human-in-the-loop matching queue order to prioritize confirmation of matches responsive to entity queries 140/240 from clients 138.

In some implementations, the performance of trained entity matching predictive model 250 may be significantly poorer for a particular type of entity than for others. For instance, trained entity matching predictive model 250 may perform less well when matching movies than when matching athletes. In those implementations, hardware processor 104 may execute metadata aggregation software code 120/220 to utilize trained entity matching predictive model 250 to discover its own entity matching failures based on its inability to generate confirmed matches 266a/266b in response to at least some of entity queries 140/240.

When entity matching failures are identified in action 310, flowchart 300 can continue with optionally prioritizing the retraining of trained entity matching predictive model 250 to reduce the entity matching failures (action 311). In some implementations, optional action 311 may advantageously be performed in an automated process by metadata aggregation software code 120/220, executed by hardware processor 104, and using training module 256 to obtain updated training data 268 that is selected so as to prioritize reduction of the entity matching failures. For example, where the entity matching failures are greatest for movies and significantly less for athletes, trained entity matching predictive model 250 may be retrained on updated training data 268 including more movies than athletes.

Thus, the present application discloses systems and methods for performing metadata aggregation using a trained entity matching predictive model that overcome the drawbacks and deficiencies in the conventional art. By using the trained entity matching predictive model to match metadata from different sources with an entity described by the metadata, and to further score the confidence of each match in an automated process, the present metadata aggregation solution advantageously provides substantially all of the efficiency benefits of a fully automated solution. In addition, by utilizing a "human-in-the-loop" process in which a human editor is called upon to confirm or reject only matches having a confidence value less than a certainty threshold, the present solution further advantageously enables the accuracy that has traditionally only been provided by manual metadata aggregation solutions.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A metadata aggregation system comprising:
a computing platform including a hardware processor and a system memory;
a software code stored in the system memory, the software code including a trained entity matching predictive model trained using training data obtained from a reference database;
the hardware processor configured to execute the software code to:
obtain a plurality of metadata inputs from a plurality of sources;
conform the plurality of metadata inputs to a common format;
match, using the trained entity matching predictive model, at least some of the conformed plurality of metadata inputs to a same entity to generate a plurality of matches;
determine, using the trained entity matching predictive model, a confidence score for each of the plurality of matches;
send a confirmation request to at least one human editor for confirmation of each of the plurality of matches having a respective confidence score greater than a first threshold score and less than a second threshold score; and
update the reference database, in response to receiving a confirmation of at least one of the plurality of matches as a confirmed match from the at least one human editor, to include the confirmed match in the reference database.

2. The metadata aggregation system of claim 1, wherein the hardware processor is further configured to execute the software code to:
obtain an updated training data from the updated reference database; and
retrain, using the updated training data, the trained entity matching predictive model.

3. The metadata aggregation system of claim 2, wherein the hardware processor is further configured to execute the software code to:
receive a plurality of entity queries from at least one client of the metadata aggregation system;
identify, using the trained entity matching predictive model, a plurality of entity matching failures based on null-results in response to at least some of the plurality of entity queries; and
prioritize the retraining of the trained entity matching predictive model to reduce the plurality of entity matching failures.

4. The metadata aggregation system of claim 1, wherein the hardware processor is further configured to execute the software code to:

perform an automated identification of each of the plurality of matches having a respective confidence score greater than or equal to the second threshold score as another confirmed match; and further update the updated reference database to include the another confirmed match in the updated reference database.

5. The metadata aggregation system of claim 4, wherein the hardware processor is further configured to execute the software code to:

obtain a further updated training data from the further updated training database; and retrain, using the further updated training data, the trained entity matching predictive model.

6. The metadata aggregation system of claim 5, wherein the hardware processor is further configured to execute the software code to:

receive a plurality of entity queries from at least one client of the metadata aggregation system;

identify, using the trained entity matching predictive model, a plurality of entity matching failures based on null-results in response to at least some of the plurality of entity queries; and prioritize the retraining of the trained entity matching predictive model to reduce the plurality of entity matching failures.

7. The metadata aggregation system of claim 1, wherein the hardware processor is further configured to execute the software code to:

perform an automated identification of each of the plurality of matches having a respective confidence score less than or equal to the first threshold score as a mismatch; and prevent the reference database from being updated to include the mismatch.

8. The metadata aggregation system of claim 1, wherein at least one of the plurality of sources of the plurality of metadata inputs comprises at least one of a knowledge base or a news source.

9. The metadata aggregation system of claim 1, wherein at least one of the plurality of sources of the plurality of metadata inputs comprises a social media platform.

10. The metadata aggregation system of claim 1, wherein the same entity is one of an athlete, a sports team, a sports league, a movie, a movie franchise, a video game, a linear television program or series, a web television program or series, an actor, or a fictional character.

11. A method for use by a metadata aggregation system including a computing platform having a hardware processor and a system memory storing a software code, the software code including a trained entity matching predictive model trained using training data obtained from a reference database, the method comprising:

obtaining, by the software code executed by the hardware processor, a plurality of metadata inputs from a plurality of sources;

conforming, by the software code executed by the hardware processor, the plurality of metadata inputs to a common format;

matching, by the software code executed by the hardware processor and using the trained entity matching predictive model, at least some of the conformed plurality of metadata inputs to a same entity to generate a plurality of matches;

determining, by the software code executed by the hardware processor and using the trained entity matching predictive model, a confidence score for each of the plurality of matches;

sending, by the software code executed by the hardware processor, a confirmation request to at least one human editor for confirmation of each of the plurality of matches having a respective confidence score greater than a first threshold score and less than a second threshold score; and updating the reference database, by the software code executed by the hardware processor in response to receiving a confirmation of at least one of the plurality of matches as a confirmed match from the at least one human editor, to include the confirmed match in the reference database.

12. The method of claim 11, further comprising:

obtaining, by the software code executed by the hardware processor, an updated training data from the updated reference database; and retraining, by the software code executed by the hardware processor and using the updated training data, the trained entity matching predictive model.

13. The method of claim 12, further comprising:

receiving, by the software code executed by the hardware processor, a plurality of entity queries from at least one client of the metadata aggregation system;

identifying, by the software code executed by the hardware processor and using the trained entity matching predictive model, a plurality of entity matching failures based on null-results in response to at least some of the plurality of entity queries; and prioritizing, by the software code executed by the hardware processor, the retraining of the trained entity matching predictive model to reduce the plurality of entity matching failures.

14. The method of claim 11, further comprising:

performing, by the software code executed by the hardware processor, an automated identification of each of the plurality of matches having a respective confidence score greater than or equal to the second threshold score as another confirmed match; and further updating, by the software code executed by the hardware processor, the updated reference database to include the another confirmed match in the updated reference database.

15. The method of claim 14, further comprising:

obtaining, by the software code executed by the hardware processor, a further updated training data from the further updated training database; and retraining, by the software code executed by the hardware processor and using the further updated training data, the trained entity matching predictive model.

16. The method of claim 15, further comprising:

receiving, by the software code executed by the hardware processor, a plurality of entity queries from at least one client of the metadata aggregation system;

identifying, by the software code executed by the hardware processor and using the trained entity matching predictive model, a plurality of entity matching failures based on null-results in response to at least some of the plurality of entity queries; and prioritizing, by the software code executed by the hardware processor, the retraining of the trained entity matching predictive model to reduce the plurality of entity matching failures.

17. The method of claim 11, further comprising:
performing, by the software code executed by the hardware processor, an automated identification of each of the plurality of matches having a respective confidence score less than or equal to the first threshold score as a mismatch; and
preventing, by the software code executed by the hardware processor, the reference database from being updated to include the mismatch.

18. The method of claim 11, wherein at least one of the plurality of sources of the plurality of metadata inputs comprises at least one of a knowledge base or a news source.

19. The method of claim 11, wherein at least one of the plurality of sources of the plurality of metadata inputs comprises a social media platform.

20. The method of claim 11, wherein the same entity is one of an athlete, a sports team, a sports league, a movie, a movie franchise, a video game, a linear television program or series, a web television program or series, an actor, or a fictional character.

* * * * *